(12) United States Patent
Rich et al.

(10) Patent No.: US 7,227,292 B2
(45) Date of Patent: Jun. 5, 2007

(54) METHODS OF DEPOSITING PIEZOELECTRIC FILMS

(75) Inventors: Paul Rich, Wooton-Under-Edge (GB); Mark Ashley Ford, Bristol (GB)

(73) Assignee: Aviza Technologies, Inc., Newport, Gwent (GB)

( * ) Notice: Subject to any disclaimer, the term of this patent is extended or adjusted under 35 U.S.C. 154(b) by 12 days.

(21) Appl. No.: 10/817,888

(22) Filed: Apr. 6, 2004

(65) Prior Publication Data

US 2004/0200049 A1    Oct. 14, 2004

Related U.S. Application Data

(60) Provisional application No. 60/468,263, filed on May 7, 2003.

(30) Foreign Application Priority Data

Apr. 10, 2003    (GB)    ................. 0308249.2

(51) Int. Cl.
*H01L 41/08* (2006.01)
(52) U.S. Cl. ..................... 310/312; 29/25.35
(58) Field of Classification Search ................ 310/312; 29/25.35
See application file for complete search history.

(56) References Cited

U.S. PATENT DOCUMENTS

| 3,422,371 | A | * | 1/1969 | Newkirk et al. ......... 331/107 A |
| 4,502,932 | A | | 3/1985 | Kline et al. ............ 204/192 EC |
| 5,646,583 | A | | 7/1997 | Seabury et al. ............. 333/187 |
| 6,019,000 | A | * | 2/2000 | Stanke et al. ................. 73/622 |
| 6,051,907 | A | * | 4/2000 | Ylilammi ..................... 310/312 |
| 6,407,649 | B1 | * | 6/2002 | Tikka et al. ................. 333/133 |
| 6,521,100 | B2 | * | 2/2003 | Molarius et al. ....... 204/192.18 |
| 6,943,648 | B2 | * | 9/2005 | Maiz et al. ................. 333/188 |
| 2001/0026981 | A1 | | 10/2001 | Bower et al. ............... 438/297 |
| 2003/0020365 | A1 | | 1/2003 | Yamada et al. | |

FOREIGN PATENT DOCUMENTS

| EP | 1 221 770 A1 | 7/2002 |
| EP | 1 253 713 A2 | 10/2002 |
| JP | 11-163668 * | 6/1999 |
| WO | WO 98/15984 | 4/1998 |
| WO | WO 2004/019426 A1 | 3/2004 |

\* cited by examiner

*Primary Examiner*—Thomas M. Dougherty
(74) *Attorney, Agent, or Firm*—Volentine & Whitt, PLLC

(57) ABSTRACT

This invention relates to methods of depositing piezoelectric films such as in part of a stack including depositing a piezoelectric layer, measuring the thickness of the layer and depositing a further film or films such that the combined thickness is substantially equal to the target thickness.

15 Claims, 6 Drawing Sheets

METHODS OF DEPOSITING PIEZOELECTRIC FILMS

CROSS REFERENCE TO RELATED APPLICATION(S)

A claim to priority is made to U.S. Provisional Applications Ser. No. 60/468,263, filed May 7, 2003 and to British Patent Application No. 0308249.2 filed Apr. 10, 2003.

BACKGROUND OF THE INVENTION

1. Field of the Invention

The present invention relates to methods of depositing piezoelectric films for example for use in methods of manufacturing Micro Electrical Mechanical Systems (MEMS), and in particular, RF MEMS devices such as thin film acoustic resonators used as filters in wireless and electrical circuits, where film thickness of film stack height affect the operational parameters of the system or device. Acoustic resonators contain a piezoelectric layer and at least a lower electrode, which together set a characteristic resonant frequency (which may be tuneable) enabling the resonators to be used as narrow band filters. More generally the invention relates to Micro Structure Technology (MST) devices which contain a mechanically resonant structure as may be found in ink jet heads, MEMS mirrors, accelerometers and gyroscopes and similar devices containing a vibrating component.

2. Background of the Invention

Bulk Acoustic Wave (BAW) resonators use longitudinal acoustic waves in thin piezoelectric material to filter signals and may be considered as the functional equivalent of a tank circuit. Fundamentally, there are two main designs in use for BAW resonators: Solidly Mounted Resonators (SMR's) and Film Bulk Acoustic Resonators (FBAR's). FIG. 1 shows a simplified graphic of the two approaches.

When an alternating electrical potential is applied, the piezoelectric layer will vibrate at a specific frequency converting some of the electrical energy into mechanical energy in the form of sound waves that propagate in the same direction as the electric field. At the mechanical resonance, the device also functions as an electrical resonator hence its ability to act as a filter. The mechanical resonant frequency is that for which the half wavelength of the propagated sound waves is a function of the total thickness of the resonant film.

It should be understood that the thickness accuracy and repeatability required for this application from wafer to wafer, deposition system to deposition system and over time greatly exceed those of the closely related semiconductor industry where 2%, 1 standard deviation wafer to wafer repeatability of thickness, is considered 'state of the art'.

As the thickness of the piezoelectric material is determined at the point of manufacture then reworking is required to modify subsequently the film's thickness and hence the resonate frequency. In situ film thickness monitoring is impracticable in a close-coupled sputtering process preferred for depositing these materials.

Various methodologies have been proposed or are in use to 'trim' filters after production or modify their frequency of operation in service. U.S. Pat. No. 5,587,620 details some of these prior attempts and the use of an additional tuning layer 224 in an FBAR. This is an additional conductive layer on the underside of a silicon nitride layer 204 that increases the resonant thickness and thus lowers the resonant frequency of the FBAR type resonator. In post fabrication testing, the frequency is measured and material from layer 224 is evaporated by passing current through the layer 224 until the frequency increases to the desired value. An alternative method is offered there based on the same methodology of post manufacture testing and trimming of the resonant frequency by changing the thickness of the resonant structure of an FBAR. No solution is offered for an SMR, without etching the back of the wafer until it resembles an FBAR. These tuning processes are performed on an individual filter after it has been manufactured and built. They are therefore very expensive.

There is therefore a need for a methodology for trimming the resonant frequency of acoustic resonators during the manufacturing process whilst still at the wafer stage. It should be understood that each wafer may carry thousands or perhaps hundreds of thousands of filters, perhaps integrated within integrated circuits.

SUMMARY OF THE INVENTION

From one aspect this invention provides a method that will tune the filter automatically during fabrication. This method clearly provides a significant reduction to the manufacturing costs, since tuning can be accomplished automatically on a complete wafer (that contains many filters) as opposed to individual filters during a post manufacture testing step.

Presently there are two main types of BAW filters manufactured: Film Bulk Acoustic Resonator (FBAR) or Solidly Mounted Resonator (SMR). In an FBAR device the bottom electrode is deposited on a (typically silicon nitride) membrane and by etching the back of the wafer a freestanding structure is fabricated. In contract SMR devices have the resonant structure deposited upon an acoustic mirror. This mirror effectively isolates the resonator from the substrate and is therefore of great interest for integrating acoustic resonators with other electronic devices as its function is independent of the substrate.

The resonate frequency of BAW filter is determined primarily by the acoustic path between the two interfaces on each side of the resonant part of the device. Refer now to FIG. 2, which is a cross-section of an FBAR device. This device is constructed from a piezoelectric layer 206 that is sandwiched between electrodes 207 & 209. The bottom electrode 207 is constructed on a Silicon Nitride membrane 204, which is supported by a Si substrate 202. The length of the acoustic path 220 determines the length of frequency of the FBAR.

Typically the piezoelectric material is AlN and this will generally be deposited by reactive pulsed DC sputtering using a pure Al target. The electrode materials can be manufactured from many different metals, but are typically made from aluminium, tungsten or molybdenum and these are typically deposited by DC magnetron sputtering.

During the manufacturing sequence one of the most critical steps is the deposition of the AlN layer. Reactive sputtering of an insulator is difficult to control precisely since the chamber walls; anodes etc become coated with an insulator. This is commonly referred to as the 'disappearing anode' effect. This changes the plasma characteristics of the chamber and alters the deposition rate of the AlN film. In contrast highly conductive layers such as a subsequently deposited electrode may be deposited with great repeatability over many substrates. Typically the piezoelectric layer is significantly thicker than the electrode layers in the stack, so that in practice the variations in AlN thickness dominate the resonant frequency of the finished device.

The applicants have applied an improved magnetron (see, for example, WO-A-02/47110) and wafer indexing (see, for example, U.K. Patent Application No. 0215699.0) to achieve extremely high uniformity across the wafer, but it is also critical to control repeatability and absolute thickness of deposition of the piezoelectric layer from substrate to substrate, throughout the sputter target life, and from system to system. Such thickness stability is of a higher requirement than in purely electrical circuits.

The ideal situation would be to install some form of insitu measurement equipment in the piezoelectric layer deposition module and to control the deposition sequence directly. In a modern PVD system such as a sputtering system this is not practical since targets are typically close coupled to the substrate in use and operate over very long lifetimes without service access to the vacuum chamber. A planar rotating magnetron configuration results in sputter targets with full-face erosion that are positioned directly in front of the wafer. This particularly restricts access so that installation of a measurement tool becomes impractical.

The Applicants have developed a measurement station, using a spectrometer (FIG. 3) mounted outside the deposition chamber, but within the vacuum system of a multi-chamber sputtering tool. In practice this measurement equipment could also be installed in the wafer handler of a Physical Vapour Deposition (PVD) cluster tool such as the Applicants' Sigma® machine.

The manufacturing flow allows a deposition sequence of the piezoelectric layer and upper, lower or both electrodes to be deposited in a single PVD cluster tool. This allows a degree of control during manufacture. The piezoelectric layer is at least partially deposited in a chamber of the cluster tool. After deposition the film thickness of this piezoelectric layer is measured outside this depositing chamber but within the cluster tool. The information from the measurement station with regard to the piezoelectronic film thickness is fed to a control computer and associated software for adjustment of the deposition steps on subsequent wafers. The measurement may take place at multipoints to enable 'across wafer' measurements so that the target thickness may be substantially achieved across the wafer (workpiece) or a part thereof.

Thus the thickness information is 'fed back' to adjust the thickness of the next piezoelectric layer upon the next wafer thereby acting as part of a feed back loop to aid repeatability and compensate for process drift from e.g. the 'disappearing anode' effect, target consumption etc. This 'feed back' may change the target power, pressure or the process time or a combination of these. Clearly this 'feed back' does not benefit the measured wafer because the measurement is not simultaneous with the process. Further, 'feed back' only improves stability if the process is already stable and has only a systemic or predictable error such as a regular decrease in thickness deposited over time e.g. due to target erosion. What it cannot correct for is random fluctuations where so-called 'corrections' based on the previous wafer may actually make repeatability worse.

A method of depositing a piezoelectric layer as part of a resonant structure of predetermined resonant frequency, including depositing a layer of piezoelectric material having a thickness of less than a target thickness, measuring the thickness of the deposited layer and depositing a film on the layer such that the thickness of the resonant structure including the film and the layer is substantially equal to the target thickness.

From a further aspect the invention consists in a method of depositing a piezoelectric layer as part of a resonant structure of predetermined resonant frequency, including depositing a layer of piezoelectric material having a thickness of less than a target thickness, the predetermined resonant frequency being a function of the target thickness, measuring the thickness of the deposited layer and depositing a film on the layer such that the thickness of the resonant structure including the film and the layer is substantially equal to the target thickness.

The film may be the same material as the layer, in which case it may be deposited in the same chamber as the original layer. This latter approach would assist in enhancing accuracy of the film depth, because the previously deposited layer thickness would indicate the instant relationship between the actual deposition rate given by the chamber and its design deposition rate, but in certain circumstances it may result in over complex wafer handling requirements leading to additional cost. This would be particularly true for batch processing.

Alternatively the film may be of a different material, in which case it is preferred that the material used is one which can be deposited with greater accuracy than the piezoelectric layer. The film is preferably conductive, in which case it may constitute or form part of an electrode for use with the piezoelectric layer.

The piezoelectric layer is preferably and conveniently may be AlN. In this case the thickness measurement may be done optically.

Other non-contact measuring approaches such as acoustic, electromagnetic (e-beam, x-ray, etc.), and laser induced acoustic or laser induced resonance may be used. Contact measuring approaches would include weighing, probe, displacement (AFM), etc.

From another aspect the invention also consists in a method of forming a resonator having a predetermined resonance frequency including, depositing an electrode, depositing a piezoelectric layer using the method as claimed in any one of the preceding claims and depositing a further electrode, if one has not been deposited in a preceding step.

From a still further aspect the invention includes resonators and other devices made by the methods defined above.

Although the invention has been defined above, it is to be understood it includes any inventive combination of the features set out above.

BRIEF DESCRIPTION OF THE DRAWINGS

The invention may be performed in various ways and specific embodiments will now be described, by way of example, with reference to the accompanying drawings, in which.

DETAILED DESCRIPTION OF THE PREFERRED EMBODIMENTS

Figure 1A:
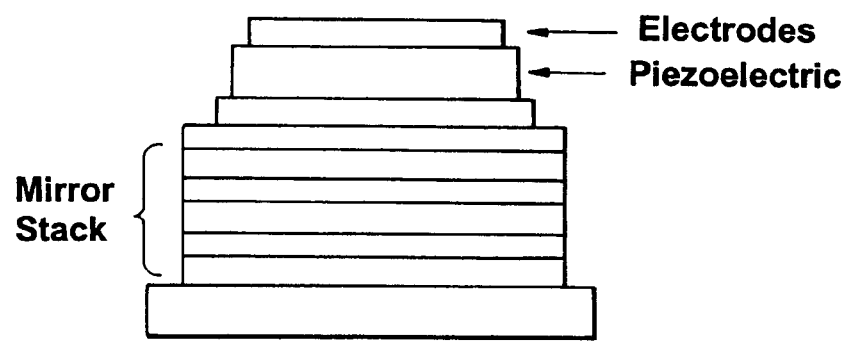
FIG. 1 is a schematic view of the basic structures of solidly mounted resonators and film bulk acoustic resonators in (a) and (b) respectively.
Figure 1B:
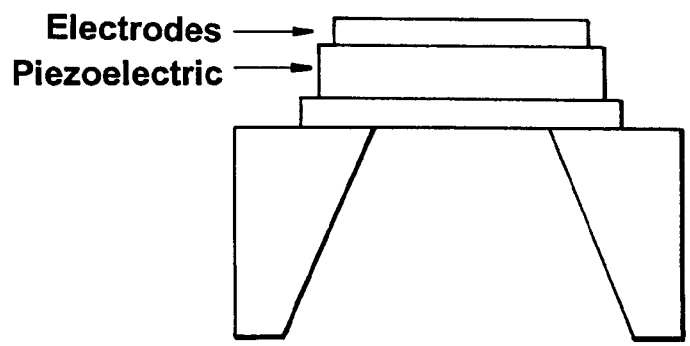
Figure 2:
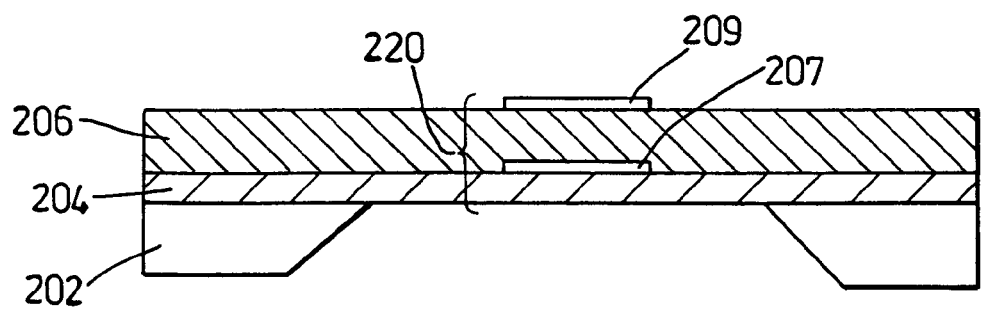
FIG. 2 is a cross section through a film bulk acoustic resonator.

As has been discussed above the measured result may be 'fed forward' to adjust the thickness of an additional layer, being either a continuation of the piezoelectric layer, an upper electrode layer upon the piezoelectric layer or an additional 'tuning' layer upon the same substrate. In this manner the measured wafer benefits from the measurement.

Clearly a separate 'tuning' layer could be deposited within the scope of this invention, but preferably it is a continuation of the piezoelectric layer itself or an upper electrode layer that is adjusted.

The measurement station measures the deposited thickness by any appropriate means and a software program compares the measure value to the expected thickness. A correction thickness is calculated based on actual already deposited plus/minus an offset calculated by the difference between measured and expected thickness. The substrate then receives additional material to bring it to the desired final thickness.

So, for example where the desired thickness is 1.5 microns of piezoelectric layer then an initial thickness may be deposited and the piezoelectric layer measured for thickness. This initial thickness could be quite well below the desired thickness e.g. 0.8 micron, but it is preferred to aim close to but below the desired thickness e.g. 1.4 micron, because then the top up layer can be particularly closely controlled. By way of example, if when aiming for 0.8 microns, that layer, when measured, is 0.7 microns then an addition layer may be deposited on the same substrate in the same deposition chamber that both corrects for the difference between intended and actual and also takes the piezoelectric layer to its final desired thickness. e.g. $(1.5-0.7) \times (0.8/0.7) = 0.912$ microns, rather than the additional 0.7 microns that might have been assumed without measurement and feed forward correction.

So the second layer thickness is set at: final thickness less initial measured thickness multiplied by a correction factor based of the actual vs. desired thickness of the initial thickness deposited. Clearly more iterations may be made. By getting good control of the piezoelectronic layer of the stack the target thickness of the stack which corresponds to the predetermined resonant frequency can be readily achieved, as the other depositions can be closely controlled using existing techniques.

If the piezoelectric layer is deposited as a single layer then the thickness measurement of the piezoelectric layer may be used to adjust the thickness of a top electrode (or tuning layer) to compensate for the variation in the measured piezoelectric layer thickness on that wafer. The change in thickness of the top electrode could be calculated using an algorithm equation or determined from a look up table. This compensating top electrode allows the acoustic path 220 to be adjusted automatically during the later stages of the manufacturing process. This automatic adjustment allows consistent filter frequency performance on a wafer-to-wafer basis.

Very accurate measurement and repeatability of measurement, integrated into a vacuum environment with minimum mechanical movement or contact with the substrate is required from the thickness measurement station to ensure the correct piezoelectric film thickness is measured with the minimum added defects.

Aluminium nitride, the preferred piezoelectric layer, is transparent and lies upon a reflective electrode. This structure therefore readily lends itself to extremely accurate commercially available optical metrology such a spectroscopic film thickness measurement. Spectroscopic measurement also lends itself well to integration as it only requires a suitably transparent window into the vacuum environment and no substrate contact. Other thickness measurement techniques are well known or may subsequently be developed, the precise nature of which does not affect this invention.

Figure 3:
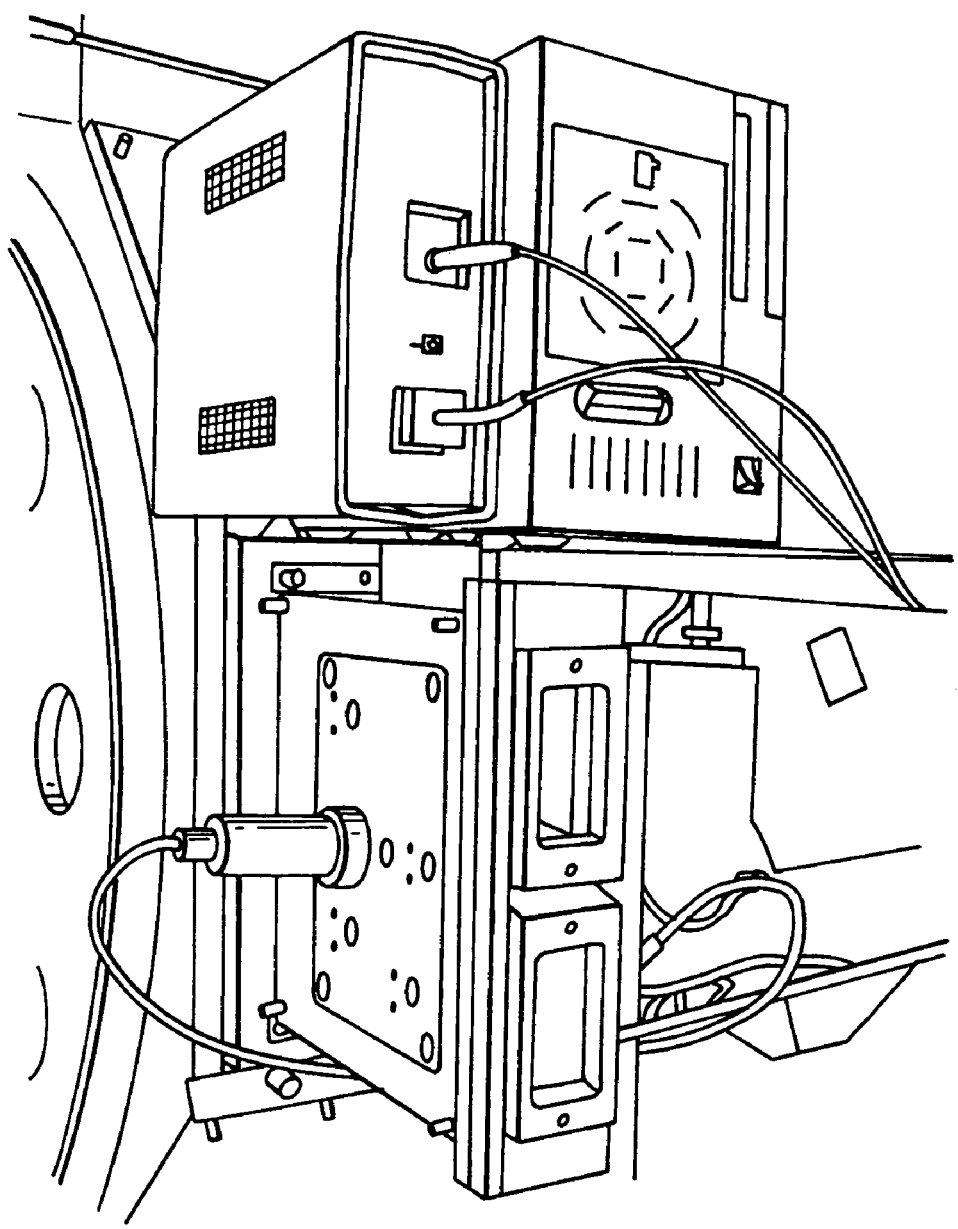
FIG. 3 is a photograph of an optical thickness measuring device.
Figure 4:
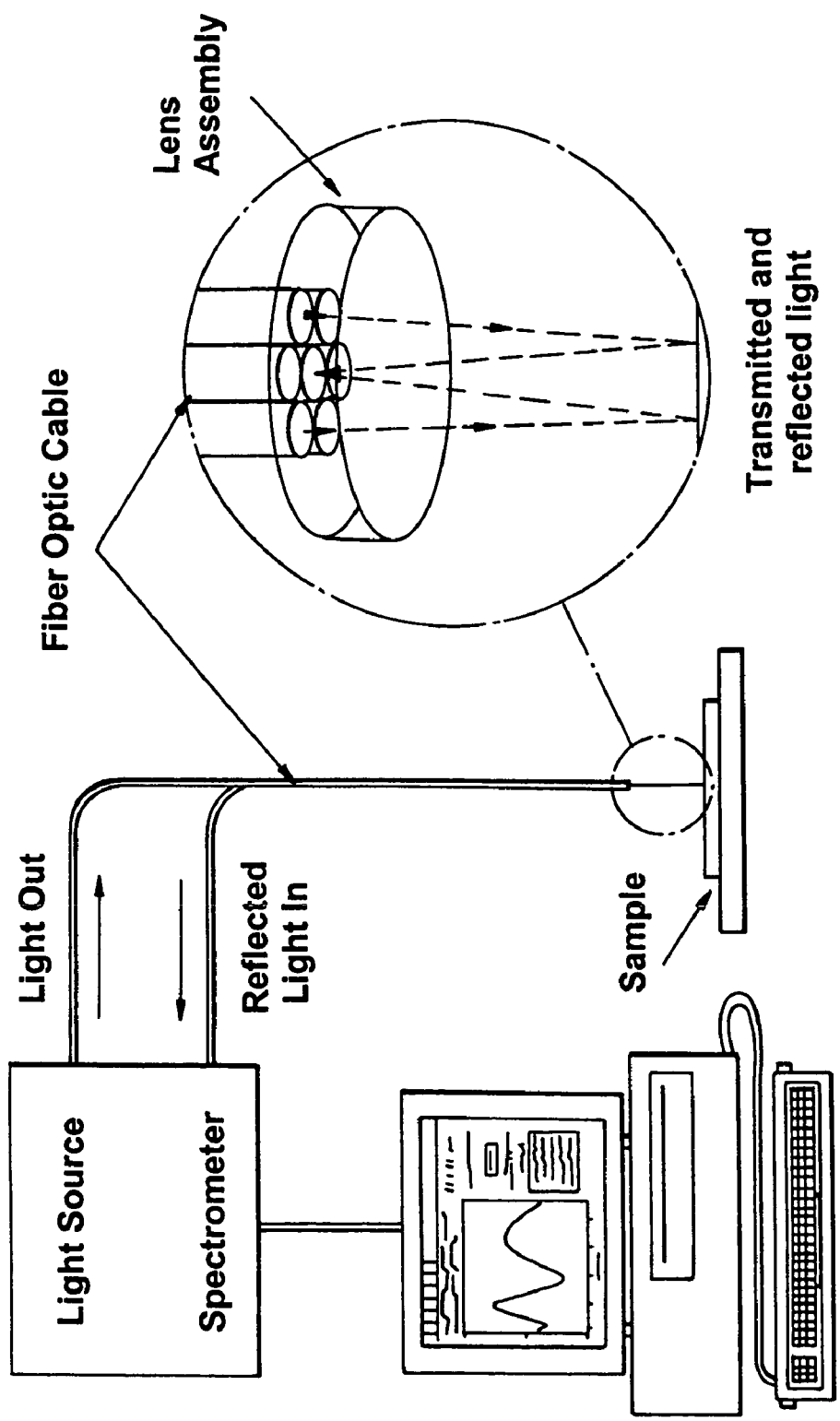
FIG. 4 is a schematic illustration of the device of FIG. 3.

A suitable metrology instrument is a Filmetrics F20 and at FIG. 3 can be seen a photograph of a Filmetrics F20 integrated with a multichamber single wafer sputtering system where it is mounted to a port attached to the wafer transport module without a separating gate valve and within the wafer transport vacuum system. At FIG. 4 is a diagram of the Filmetrics F20. A remote light source and spectrometer are optically connected to the port of the vacuum system by a fibre optic bundle. A computer system and software operate the instrument and it is capable of calculating both the film thickness and its refractive index.

Whilst single point measures are useful, ideally a multi-point measurement of the substrate would be made and this may be achieved by scanning the substrate under a fixed analysis point e.g. by passing the substrate on a wafer transport arm under the spectroscopic head. The multi-measurement can be several measurements at the same point. This is simple, but improves accuracy by smoothing out errors in the thickness measurement. A simple arm extension can thereby effect a radial scan across a substrate such as a wafer. By having a line of spectroscopes a series of parallel radial scans may be carried out by a wafer arm extension to effect e.g. a 49 point analysis as is typical of thickness measurements in use in semiconductor manufacturing.

Figure 5:
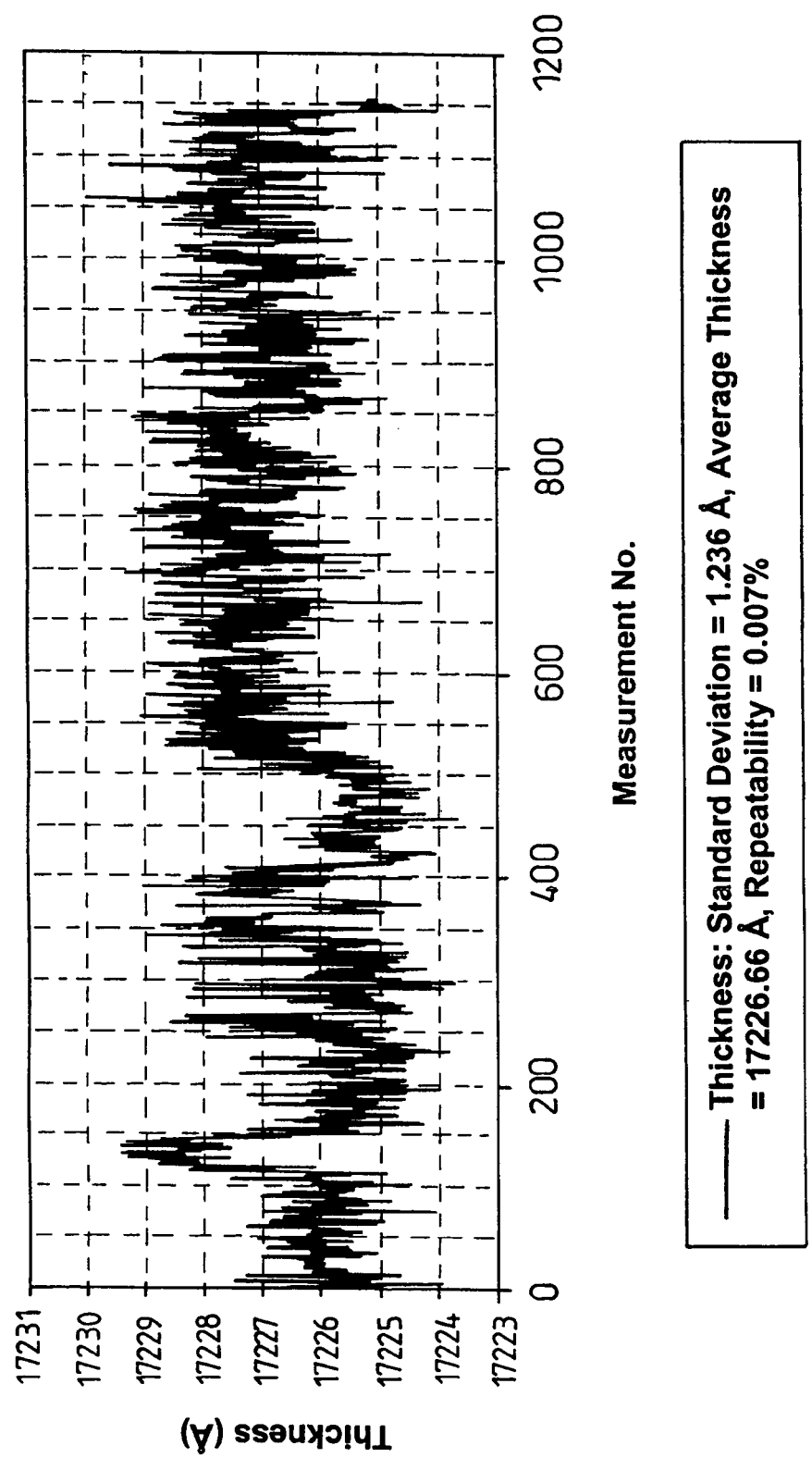
FIG. 5 is a graph illustrating the repeatability of thickness measurements taken the equipment of FIGS. 3 and 4 in which the x-axis indicates the number of measurements taken.

The spectroscopic measurement instrument used demonstrates extremely repeatable film thickness measurements as can be seen in the data shown in FIG. 5. Here the same film on the same wafer was measured every 5 minutes over a 4 day period. The repeatability is 0.007% 1 sigma (standard deviation).

In principal this technique could be extended to also compensate for variations in piezoelectric layer thickness across the wafer as well. Multi point measurements could be performed and a uniformity map of piezoelectric thickness could be obtained. The uniformity of the top-up piezoelectric, electrode or tuning layer thickness could then be adjusted to compensate for across wafer non-uniformity of the piezoelectric film. The Applicants' improved magnetron described in WO-A-02/47110 is capable of programmed movement of the magnetron behind the target and thus could be driven in a manner to compensate at least partially for across wafer uniformity of thickness variations either in a feed back or feed forward control loop.

In addition the measurement station can measure the refractive index of the piezoelectric film to give an indication of film quality. If the refractive index is outside a set tolerance level, the control loop initiated by the measurement could put the piezoelectric film deposition station into a wait state for service attention. This would protect further product wafers from being scrapped, due to problems with piezoelectric film quality.

Figure 6:
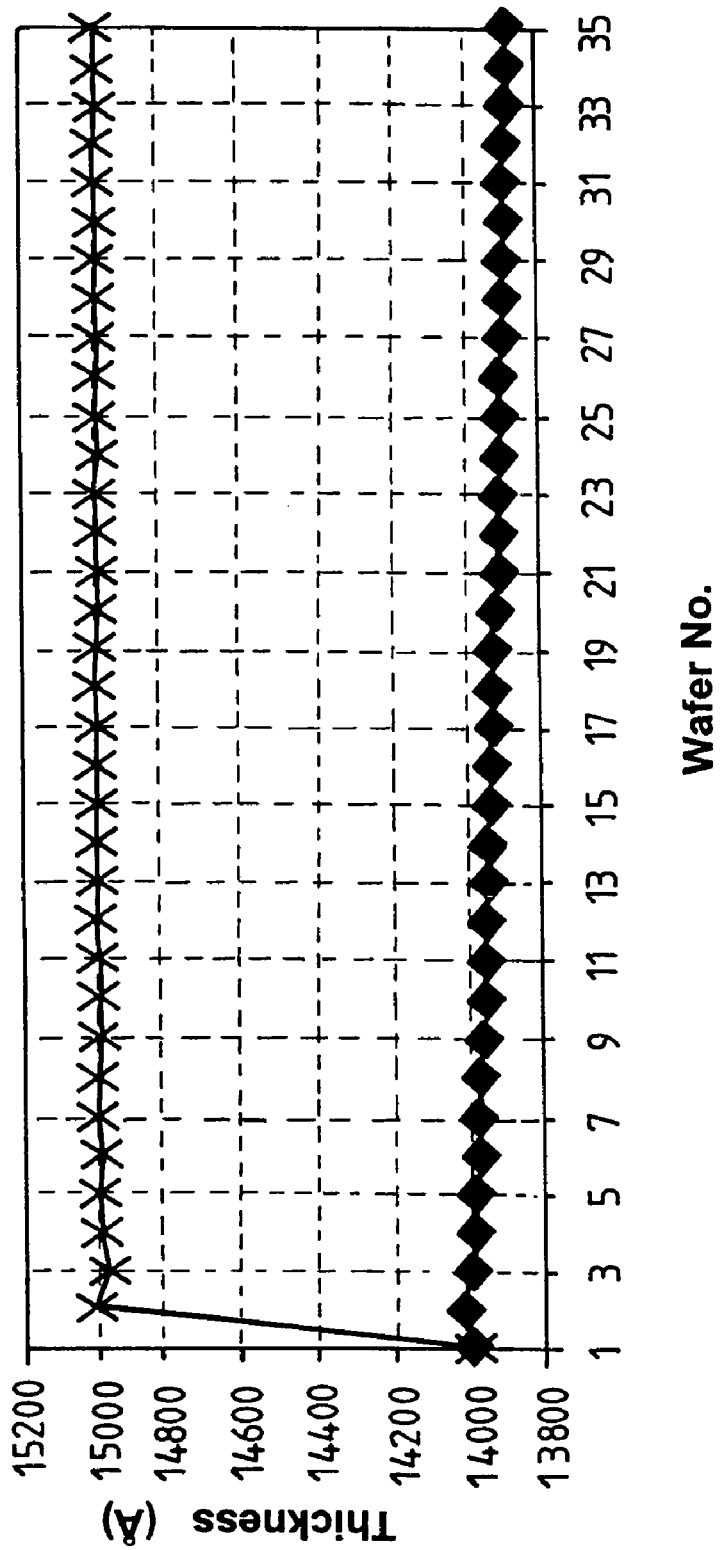
FIG. 6 is a graph showing the corrections which can be achieved with a feedback system with a relatively stable process.

FIG. 6 is a chart of thickness variation from wafer to wafer both 'uncorrected' and with 'feed back' for an optimised sputtering system. The desired aluminium nitride thickness was 1.5 microns. The first wafer when measured showed that actual film thickness was 1.4 microns. A correction was therefore applied to the power to the sputter target for the following wafer immediately taking the film thickness to 1.5 microns where it stayed, within 0.05%, 1 sigma. In contrast, without any correction the film thickness stayed at 1.4 microns and drifted downwards systemically such that not only was the film thickness not at the desired thickness but from wafer to wafer it was varying by 0.27%, 1 sigma.

It should be understood that considerable work had been carried out to improve the inherent stability of the sputtering system, represented by the already good 0.27% repeatability of an uncorrected system. With a less stable system it was found that feed back correction may actually make repeatability worse, not better. If there is not a systemic trend from wafer to wafer then a feed back correction to the next wafer cannot be calculated with any precision.

In contrast feed forward, as proposed in this Application eliminates the 'first wafer' effect and surprisingly does not require the same levels of systemic stability as the correction is be carried out on the measured wafer. Feed forward also increases the repeatability (even of well designed systems with small systemic variations as above) still further to something similar to the repeatability of the measurement instrument, e.g. 0.007% in the case of the Filmetrics F20 metrology unit.

Figure 7:
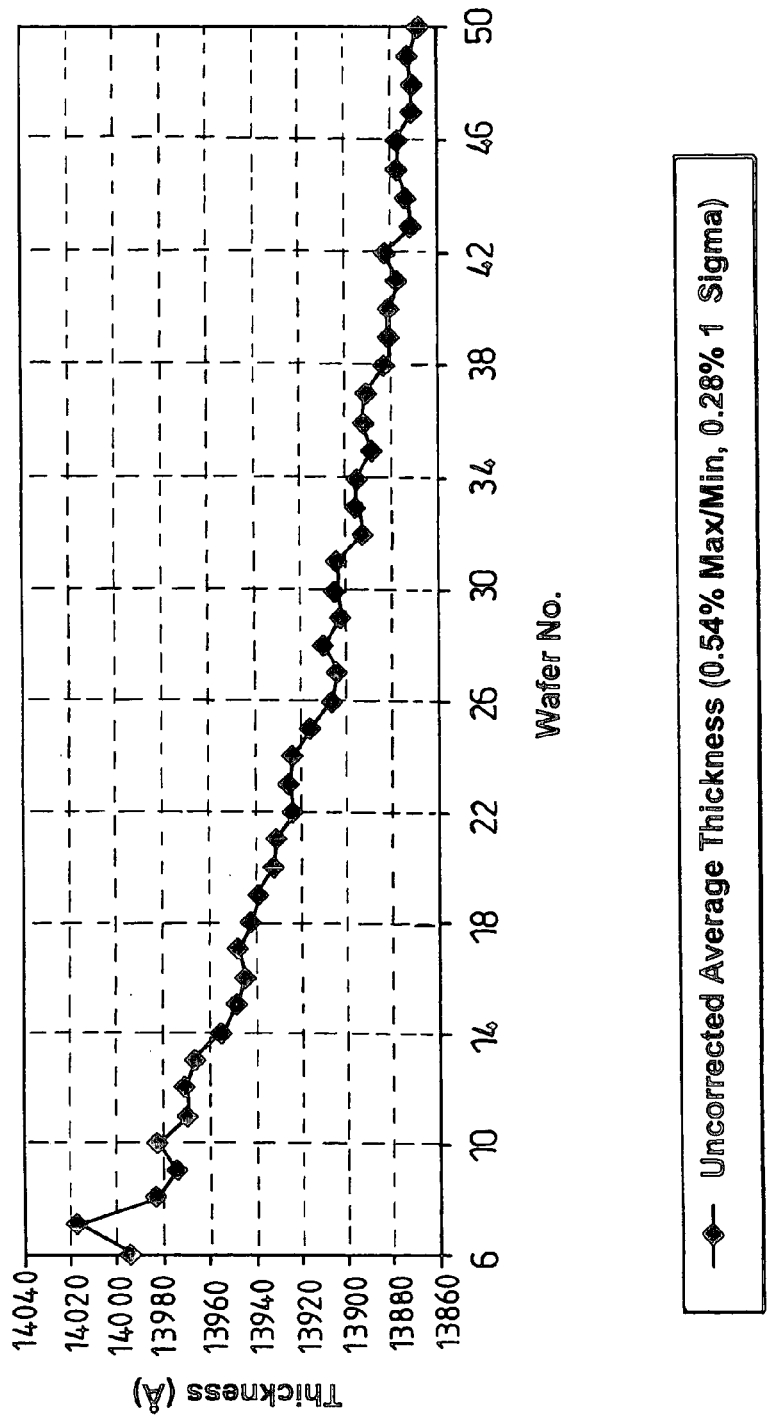
FIG. 7 is a graph showing the variation in thickness with processed wafer as a batch of wafers is processed in a chamber for a relatively unstable process.

Clearly if the piezoelectric layer deposition thickness repeatability is very poor, e.g. as shown in FIG. 7, then using feed forward to change the thickness of a subsequent layer, such as an upper electrode layer, may achieve suitable compensation, as metal sputtering is inherently more stable that piezoelectric material sputtering. As long as the piezoelectric layer is thick enough to drive the device at resonant frequency then, within limits, different thicknesses of piezoelectric layer and upper "tuning" and/or electrode layers are possible as long as the acoustic thickness remains within tight limits. Clearly the methods described here may be applied to any resonant structure that requires extremely tight control of its thickness. It will be understood that if the piezoelectric layer is too thick, then the system may deposit a thinner electrode to achieve the target thickness.

What is claimed is:

1. A method of depositing a stack of layers of a target thickness to provide a predetermined resonant frequency including depositing a piezoelectric layer, performing in situ a measurement of the thickness of the layer and depositing a further film or films such that the combined thickness of the stack is substantially equal to the target thickness.

2. A method as claimed in claim 1 wherein the film is the same material as the layer.

3. A method as claimed in claim 2 wherein the film is deposited in the same chamber as the layer.

4. A method as claimed in claim 1 wherein a further film is an electrode.

5. A method as claimed in claim 1 wherein the film is a different material to the layer.

6. A method as claimed in claim 5 wherein the film is an electrically conducting material.

7. A method as claimed in claim 6 wherein the film is at least part of a conducting electrode.

8. A method as claimed in claim 1 wherein the layer is optically transparent.

9. A method as claimed in claim 8 wherein the layer is AlN.

10. A method as claimed in claim 8 wherein the thickness is measured optically.

11. A method as claimed in claim 1 wherein the stack extends across at least part of a workpiece and the measuring step takes place at multiple points to allow the target thickness to be achieved substantially across the part of the workpiece.

12. A method of depositing a stack of layers of a target thickness to provide a resonant frequency including depositing an optically transparent piezoelectric layer and performing in situ an optical measurement of the thickness of the layer and depositing a further film or films such that the construed thickness of the stack is substantially equal to the target thickness.

13. A method as claimed in claim 12 wherein the film is the same material as the layer.

14. A method of forming a resonator having a predetermined resonator frequency including depositing an electrode, depositing a piezoelectric layer using the method as claimed in any one of the preceding claims and depositing a further electrode if one has not been deposited in a preceding step.

15. A method of depositing a piezoelectric layer as part of a resonant structure of predetermined resonant frequency, including depositing a layer of piezoelectric material having a thickness of less than a target thickness, performing in situ a measurement of the thickness of the deposited layer and depositing a film on the layer such that the thickness of the resonant structure including the film and the layer is substantially equal to the target thickness.

* * * * *